(12) United States Patent
Leigh et al.

(10) Patent No.: US 10,624,240 B2
(45) Date of Patent: Apr. 14, 2020

(54) FIRST AND SECOND SHIELDS FOR THERMAL ISOLATION

(71) Applicant: HEWLETT PACKARD ENTERPRISE DEVELOPMENT LP, Houston, TX (US)

(72) Inventors: Kevin Leigh, Houston, TX (US); John Norton, Houston, TX (US); George D. Megason, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/097,517

(22) PCT Filed: Apr. 29, 2016

(86) PCT No.: PCT/US2016/029988
§ 371 (c)(1),
(2) Date: Oct. 29, 2018

(87) PCT Pub. No.: WO2017/188971
PCT Pub. Date: Nov. 2, 2017

(65) Prior Publication Data
US 2019/0150319 A1    May 16, 2019

(51) Int. Cl.
*H05K 7/20* (2006.01)
*G02B 6/42* (2006.01)
(Continued)

(52) U.S. Cl.
CPC ....... *H05K 7/20518* (2013.01); *G02B 6/4269* (2013.01); *G02B 6/4273* (2013.01);
(Continued)

(58) Field of Classification Search
CPC ......................................... H05K 9/0022–0037
See application file for complete search history.

(56) References Cited

U.S. PATENT DOCUMENTS 5,587,882 A * 12/1996 Patel .................. H01L 23/3675
257/713
5,880,930 A * 3/1999 Wheaton ............ H05K 7/20409
165/80.3

(Continued)

FOREIGN PATENT DOCUMENTS

JP        H1041678 A     2/1998
JP        H11233978 A    8/1999
(Continued)

OTHER PUBLICATIONS

International Search Report and Written Opinion, International Application No. PCT/US2016/029988, dated Jan. 13, 2017, pp. 1-9, KIPO.

(Continued)

*Primary Examiner* — Robert J Hoffberg
(74) *Attorney, Agent, or Firm* — Hewlett Packard Enterprise Patent Department (57) ABSTRACT

An example device in accordance with an aspect of the present disclosure includes a first shield to provide thermal isolation between a first component and a heatsink of a second component, and to provide a cooling channel that is thermally isolated from the heatsink to receive an airflow for the first component. A second shield is to provide thermal isolation between the first shield and the heatsink, and to provide a thermal barrier region between the first shield and the second shield.

17 Claims, 6 Drawing Sheets

(51) Int. Cl.
 *H01L 23/367* (2006.01)
 *H01L 23/467* (2006.01)
 *H01L 23/36* (2006.01)

(52) U.S. Cl.
 CPC ............ *H01L 23/36* (2013.01); *H01L 23/367* (2013.01); *H01L 23/467* (2013.01); *H05K 7/20009* (2013.01)

(56) References Cited

U.S. PATENT DOCUMENTS

| | | | | |
|---|---|---|---|---|
| 5,931,222 | A * | 8/1999 | Toy | F28F 3/02 165/80.3 |
| 6,577,504 | B1 * | 6/2003 | Lofland | H01L 23/3672 165/185 |
| 7,061,773 | B2 * | 6/2006 | Chen | H05K 9/0039 361/800 |
| 7,488,901 | B2 * | 2/2009 | Arnold | H05K 9/0024 174/377 |
| 8,449,203 | B2 | 5/2013 | Downs | |
| 8,537,554 | B1 | 9/2013 | Hockaday | |
| 8,619,427 | B2 * | 12/2013 | Burton | H05K 7/20409 165/185 |
| 8,681,495 | B2 * | 3/2014 | Burton | H04N 21/426 174/547 |
| 8,929,078 | B2 * | 1/2015 | Weeber | H01L 23/552 165/80.3 |
| 8,933,558 | B2 * | 1/2015 | Watanabe | H01L 23/10 257/706 |
| 8,953,324 | B2 * | 2/2015 | Burton | H05K 7/20409 361/714 |
| 9,543,226 | B1 * | 1/2017 | Nuttall | H01L 23/13 |
| 9,859,186 | B2 * | 1/2018 | Nuttall | H01L 23/13 |
| 10,211,121 | B2 * | 2/2019 | Nuttall | H01L 23/13 |
| 2006/0220238 | A1 * | 10/2006 | Kim | H05K 9/0026 257/731 |
| 2006/0272857 | A1 * | 12/2006 | Arnold | H05K 9/0024 174/377 |
| 2013/0210269 | A1 | 8/2013 | Neer et al. | |
| 2014/0063743 | A1 | 3/2014 | Chan et al. | |
| 2015/0077937 | A1 | 3/2015 | Daly et al. | |

FOREIGN PATENT DOCUMENTS

| | | |
|---|---|---|
| JP | 2005012991 A | 1/2005 |
| JP | 2011258869 A | 12/2011 |
| KR | 2019950031751 U | 11/1995 |

OTHER PUBLICATIONS

Newegg Inc., "Rockford Fosgate PBR300X4 300 Watt 4-Channel Amplifier for Compact Sub Systems," 2016, pp. 1-5 (online), Retrieved from the Internet on Apr. 11, 2016 at URL: <newegg.com/Product/Product.aspx?Item=0HF-000D-00012>.

\* cited by examiner

FIRST AND SECOND SHIELDS FOR THERMAL ISOLATION

BACKGROUND

Components, such as optical transceivers and high-power processors, can be placed closer together to benefit electrical signaling. However, high-power processors can generate heat that can negatively affect other components, such as optical transceivers, thereby decreasing wear-out lifetime and overall system reliability.

DETAILED DESCRIPTION

Components used in systems can be high-radix chips such as controllers/processors, which have a relatively large amount of connectivity/ports/lanes and associated functionality, which uses relatively high amounts of power. As signaling performance increases over time (e.g., greater than 25 Gigabit per second (Gbps) per lane), high-speed electrical signal routing between the components (between, e.g., application-specific integrated circuits (ASICs) and optical transceivers) on a system board becomes more challenging. Co-packaging the components, such as co-packaged lasers/photonics including optical transceivers and ASICs, can help improve signaling performance. However, co-packaging (or otherwise locating components in closer proximity to each other) poses challenges when high-power, high-heat components and temperature-affected components are used.

To address such issues, examples described herein may enabled co-packaged components in close proximity to each other, while thermally isolated the temperature-sensitive components from the high-heat-generating components. In some example implementations, a layer(s) of a shield(s), which can behave as thermal insulators, can use layers of materials such as air, ceramics, Graphene, etc. to prevent conductive and radiated heat from transferring between components. The shield(s) are shaped to provide localized air flow paths for the temperature sensitive components (e.g., optical transceivers) located under the shield(s). Accordingly, the shield(s) isolate thermal zones between high-power high-heat components and temperature-sensitive components. The shield(s) are compact to enable the components to fit within a lower profile system, enabling the use in many different types of systems. For example, implementations described herein can be used with high lane-count chips with native optical interfaces, such as processors, Ethernet/IB switch ASICs, Gen-Z switch ASICs, and the like. Accordingly, the example shield(s) can be used in computing systems such as blade enclosures, server and/or storage modules, integrated switch modules, optical midplanes, top-of-rack (TOR) switches, fabric enclosures, fabric modules, and other systems containing heat generating components and/or components affected by heat.

Figure 1:
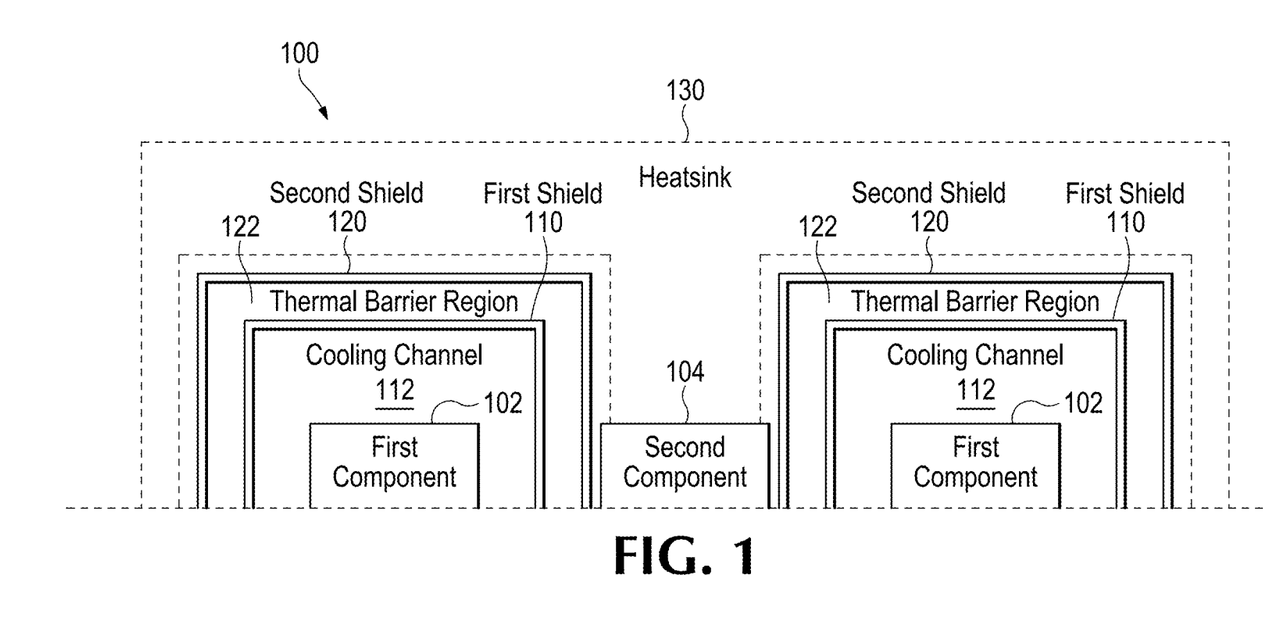
FIG. 1 is a block diagram of a system including a first shield and a second shield according to an example.

FIG. 1 is a block diagram of a system 100 including a first shield 110 and a second shield 120 according to an example. The first shield 110 is to provide thermal isolation between a first component 102 and a heatsink 130 of a second component 104. The first shield 110 also is to provide a cooling channel 112 that is thermally isolated from the heatsink 130, to receive an airflow for the first component 102. The second shield 120 is to provide thermal isolation between the first shield 110 and the heatsink 130, and to provide a thermal barrier region 122 between the first shield 110 and the second shield 120. The first component 102 is shown as a single block in FIG. 1. However, the first component 102 can also refer to a first component heatsink or other components contained in the cooling channel 112, not specifically/separately illustrated in FIG. 1 (e.g., see FIGS. 2-5).

A vulnerability can exist with temperature-sensitive optical components (such as first component 102) that are placed adjacent to high-power high-radix ASICs (such as second component 104), for the purpose of improving electrical signal integrity and lowering manufacturing costs associated with components being in close proximity to each other. The example first and second shields 110, 120 can address such vulnerabilities. The first component 102 can be provided as, e.g., an optical transceiver, to interface with an optical cable/connector (not shown in FIG. 1, see FIGS. 2, 4, 5). The second component 104 can be provided as, e.g., a high-power, high-radix controller such as a processor, application-specific integrated circuit (ASIC), fabric switch, or other types of component. The first and second components 102, 104 are situated near each other, e.g., located in the same thermal zone without the presence of the first and second shields 110, 120, installed in the same system board (e.g., provided as a co-packaged substrate), or otherwise placed in a way that (absent the first/second shields 110, 120) the first component 102 could be affected by heat from the second component 104.

The first and second shields 110, 120 enable efficient cooling and fiber management of first component 102 even if co-packaged with high-power high-radix second components 104. The first and/or second shields 110, 120 can isolate heat away from the temperature-sensitive first components 102, provide localized cooling channels 112 for optical components, and can provide cable/fiber management features (see FIGS. 2, 4, 5) to allow efficient fiber routing without affecting air flow within the localized cooling channel 112.

The first and second shields 110, 120 may form multiple layers of thermal protection. Furthermore, in some example implementations, a layer can provide a different type of thermal protection than the other layers. For example, one layer can provide reflective protection against radiated heat, another layer can provide insulation protection against convective (and/or conductive heat), another layer can provide anisotropic protection and heat extraction against convective or other forms of heat, and so on. A layer can be provided as a gap between other layers. Although five layers are shown in FIG. 1 (cooling channel 112, first shield 110, thermal barrier region 122, second shield 120, and a second thermal barrier region between the second shield 120 and heatsink 130), fewer or greater number(s) of layers can be used. For example, additional shields can be added with additional gaps between, multiple shields can be combined to form a single shield, a given shield can include multiple layers of different materials without a gap between them, or other combinations of layers may be used. The illustrated thermal barrier region 122 between the first and second shields 110, 120 may contain air or other insulator (e.g., foam). That insulator may be trapped or free flowing between the shields 110, 120. For example, the thermal barrier region 122 may be provided as a barrier cooling channel, to receive at least a portion of airflow (e.g., diverted from the cooling channel 112).

The first and second shields 110, 120 may be constructed of various materials, including dissimilar materials to provide different thermal and/or structural benefits, and combinations of different materials in a given shield (e.g., to form a shield support frame using a first material for strength/support, such as metal, die-cast, ceramic, and the like, and a shield body using a second material for thermal isolation such as plastic, silicone, and the like). A given shield can be made of a single material. Shield materials can also include injection molding materials, 3D printed materials, Graphene, Mylar, sprayable/paintable materials (such as pigments to affect color, surface finish, and/or material properties to thereby affect shield emissivity), and so on. The layers of a shield can be colored according to providing desired behavior. For example, a layer of Mylar can be colored white and/or mirrored, to improve reflectance of radiative heat. Graphene can be provided as a black color, which improves radiation behavior (e.g., of the second shield 120) by absorbing all spectrum including infrared coming from the heatsink 130, while reducing emissivity of the black second shield 120 toward the first shield 110. The first shield 110 can be colored white and/or reflective to improve emissivity/reflectance back toward the second shield 120 and away from the first component 104.

Such features enable system 100 to provide heat shielding for first components 102 even if located in close proximity to the heat sink 130 of high-power second component 104. Such features also allow for localized cooling channels 112 for the first components 102, and allow space for cable management. The first and second shields 110, 120 are shaped to allow the heatsink 130 to extend down to reach down the second component 104.

Accordingly, the example implementations described herein are compact with a low profile, and do not need extra space to locate temperature sensitive components away from other high-power components (e.g., placing second components 104 on another system board, or on a different side of a system board, than the first components 102). Placing first components 102 in close proximity to second components 104 optimizes overall performance, because it is possible to minimize signal strengths between the first and the second components 102, 104. This will reduce power consumption of the first and the second components 102, 104, resulting in reduced heat generation. In particular, lowering power consumption of the second component 104 will reduce the overall heat generation dramatically, based on the reduced heat generation of the second component 104. Additionally, the example implementations provide localized cooling channels 112, all while enabling a single-plane system board layout to accept first and second components 102, 104. A shield can provide multiple features, such as heat isolation, heat extraction, fiber management, and so on, saving real estate on the system board and costs. The example systems thereby enjoy higher reliability (i.e., longer wear-out failure) for sensitive (e.g., opto-electronic) components, as well as the associated connectors, such as optical fibers, by organizing them in isolated cooling channels 112.

Figure 2:
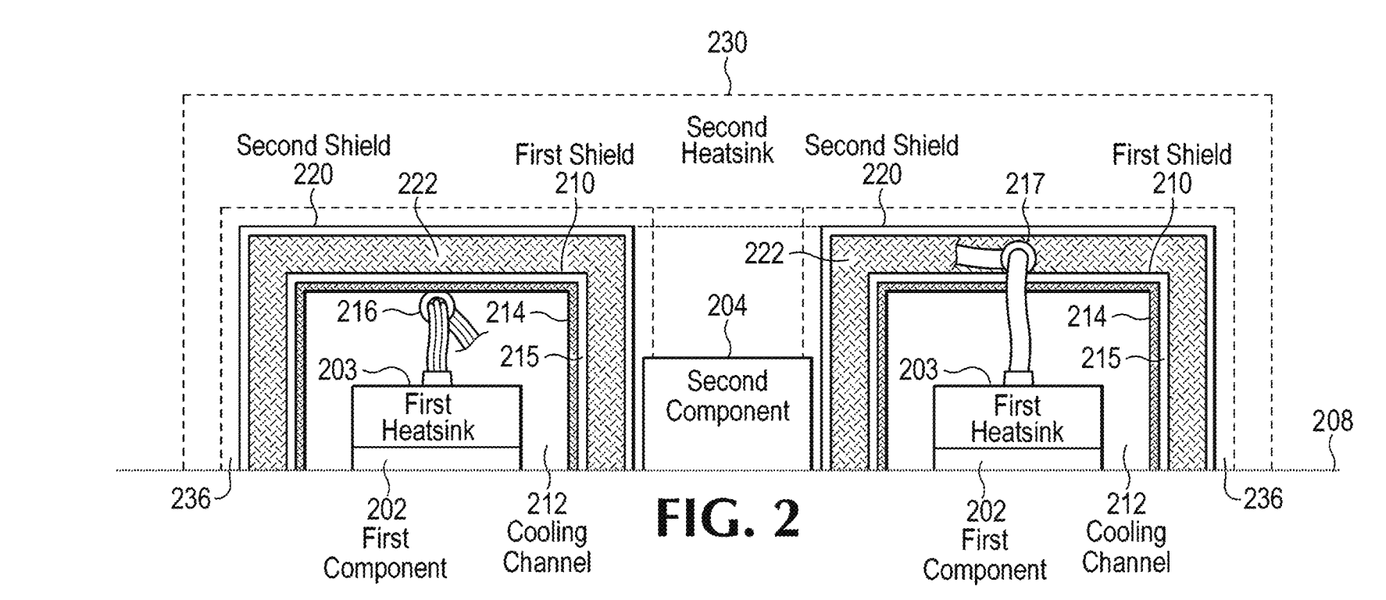
FIG. 2 is a block diagram of a system including a first shield and a second shield according to an example.

FIG. 2 is a block diagram of a system including a first shield 210 and a second shield 220 according to an example. The first shield 210 is to provide thermal isolation between a first component 202, with its associated first component heatsink 203, and second heatsink 230 of second component 204. In other words, the outer, second component heatsink 230 at least partially surrounds the first component 202 and its associated components, such as first component heatsink 203. Thus, the shields 210, 220 protect the first component 202 etc. from the heat of the second component heatsink 230. The first shield 210 includes an inner layer 214 of a first material, and an outer layer 215 of a second material. The first shield 210 also includes an inner cable management feature 216, and an outer cable management feature 217, to manage cables/connectors such as the fibers and/or electrical communications associated with the first and/or second components 202, 204. The second shield 220 is to provide thermal isolation between the first shield 210 and the heatsink 230, and to provide a thermal barrier region 222 between the first shield 210 and the second shield 220. The thermal barrier region 222 is shown filled with a fixed thermal insulator. The shields 210, 220 are shown separated from each other due to the cross-sectional nature of FIG. 2, with the second component 204 in between the shields/cooling channels. However, each of the shields 210, 220 can be provided as a unified piece, e.g., as in the example implementations shown in the perspective views of FIGS. 4 and 5. The shields 210, 220, and components 202, 204, are shown disposed on a system board 208 for simplicity, and can be disposed on multiple substrates and/or system boards not specifically shown, including those at different heights (see, e.g., FIG. 3).

The fixed thermal insulator in the thermal barrier region 222 can be, e.g., air, foam or other insulator. The second shield 220 also can be integrated with the first shield 210, such that a transition between a second material 215 of the first shield 210, and a third material of the second shield 220, serves as the thermal barrier region based on differing thermal properties of the second and third materials.

The cable management 216, 217 can be provided as loops, clips, or other components to handle the substantial high-radix and connectivity features associated with components 202, 204, to avoid signal integrity ramifications of coiling and tangling of optical fibers or other signal carriers. The first shield 210 can integrate such cable management as an extension of the first shield 210, thereby avoiding a need for additional components to provide cable management. The inner cable management feature 216 is shown contained in the localized cooling channel 212, on an inside face of the first shield 210 facing the first component 202. The outer cable management 217 is shown situated in the thermal barrier region 222 between shields 210, 220, disposed on an outside face of the first shield 210 facing the second shield 220. The cable management 216, 217 can be used on the inside and/or the outside of the first shield 210.

The shields 210, 220 can be made of various materials. The first shield 210 includes an inner layer 214 of a first material to insulate from convective heat, such as plastic. The outer layer 215 of the first shield 210 includes a second material to reflect radiant heat, such as Mylar. The second shield 220 includes a third material to provide anisotropic temperature behavior, to resist heat transfer passing through a plane of the second shield 220 from the heatsink 230 toward the first shield 210. The anisotropy temperature behavior also encourages heat transfer along the plane of the second shield 220, e.g., toward edges of the second shield 220 and on to the substrate on which the shields are disposed. For example, Graphene material can be used as the second shield 220, to provide anisotropic behavior that prevents heat transfer through a plane of the second shield 220, but encourages heat removal along the plane and towards the edges of the second shield 220. Thus, heat is spread across a surface area of the second shield 220, avoiding specific hot spots and minimizing any radiation through to the first components 202. Other materials include a metal foil layer that can be used as, or in conjunction with other materials of, the second shield 220.

The second shield 220 is shown spaced from the heatsink to provide a second thermal barrier region 236 between the second shield 220 and the heatsink 230. In alternate example implementations, the second shield 220 can be adhered to the heatsink 230, such that there is not a gap between the second shield 220 and the heatsink 230. However, the different materials between the second shield 220 (e.g., Graphene) and the heatsink 230 (e.g., copper) can serve as the second thermal barrier region 236, even if no gap. The second thermal barrier region 236 can serve as a region for moving air, similar to alternate example implementations of the thermal barrier region 122 described above with respect to FIG. 1.

The heatsink 230 includes a portion to serve as an attachment extension to contact the second component 204, and includes a cavity to accommodate the first component(s) 202. The first shield 210 includes a first pass-through to accommodate the attachment extension of the heatsink 230 and maintain thermal isolation of the cooling channel 212 from the attachment extension of the heatsink. The second shield 220 includes a second pass-through to accommodate the attachment extension of the heatsink 230 and maintain thermal isolation of the cooling channel 212 from the attachment extension of the heatsink 230.

Figure 3:
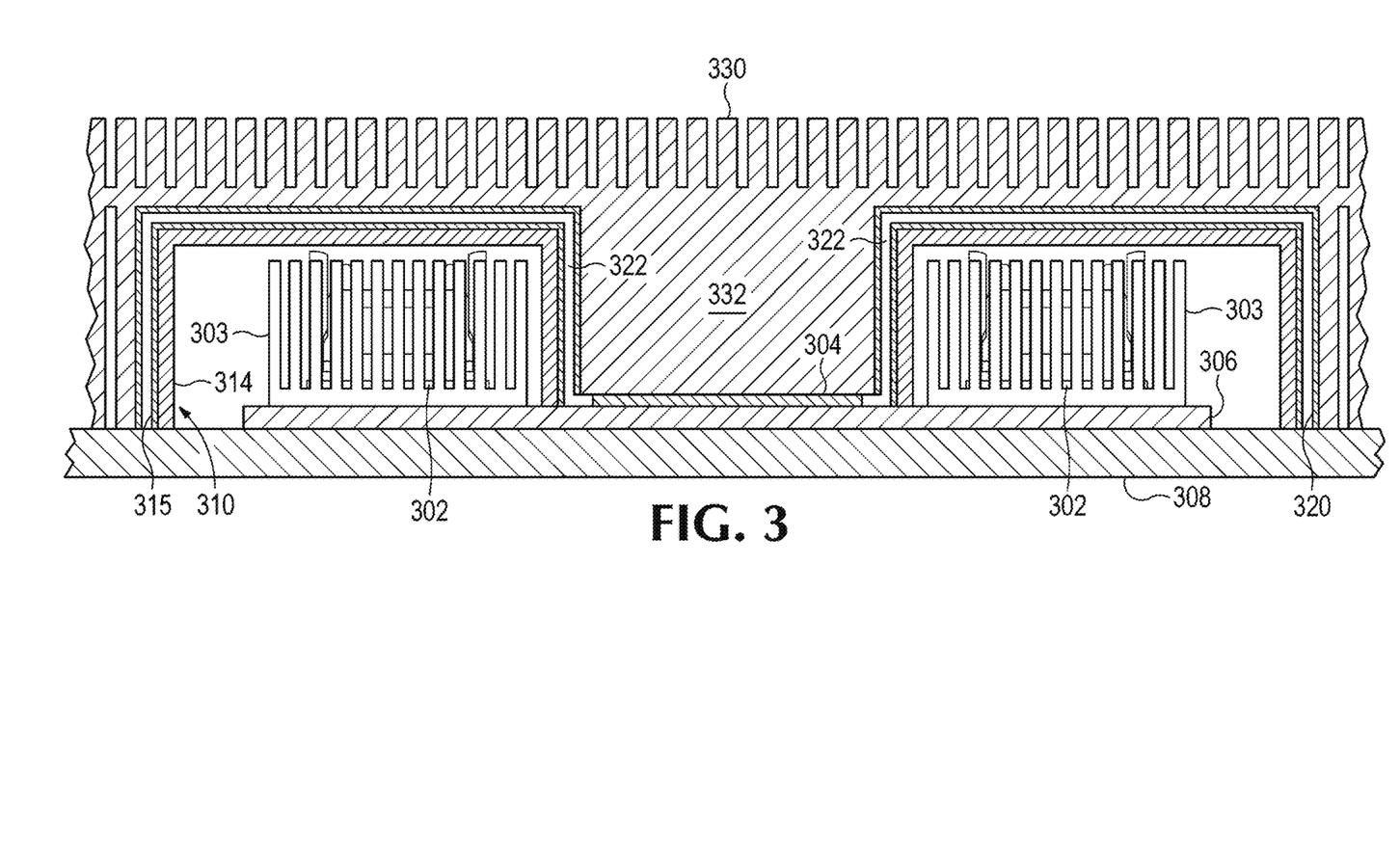
FIG. 3 is a section view of a system including a first shield and a second shield according to an example.

FIG. 3 is a section view of a system including a first shield 310 and a second shield 320 according to an example. The heatsink 330 includes attachment extension 332 to draw heat from the second component 304. There may be Thermal Interface Material (TIM) between the heatsink 330 and the second component 304. The second shield 320 is shown disposed on an inner cavity surface of the heatsink 330. The attachment extension 332 creates cavities for the first components 302 and their associated airflow cooling channels and first component heatsinks 303, which are thermally isolated from the second component 304 and the heatsink 330 by the first and second shields 310, 320. The second shield 320 is shown integrated with the heatsink 330 such that a transition between a material of the second shield 320, and a dissimilar material of the heatsink 330, serves as a thermal barrier region based on differing thermal properties of the materials. The isotropic material of the second shield 320 enables the second shield 320 to transfer heat along its planes away from the second component 304, around the interior cavity containing the airflow cooling channels and the first components 302. The shields 310, 320 are formed to accommodate different heights between the co-packaged ASIC substrate 306 and the system board 308. The low-profile nature of the system enables an air gap around the top and sides of the first component heatsink 303, ensuring ample airflow for the first component 302. Thus, the first component heatsink 303 can be provided for the first component 302, without contacting the second component heatsink 330. The first component heatsink 303 is shown from the side, obscuring the first component 302 and its connector (see FIG. 4 for more details).

Figure 4:
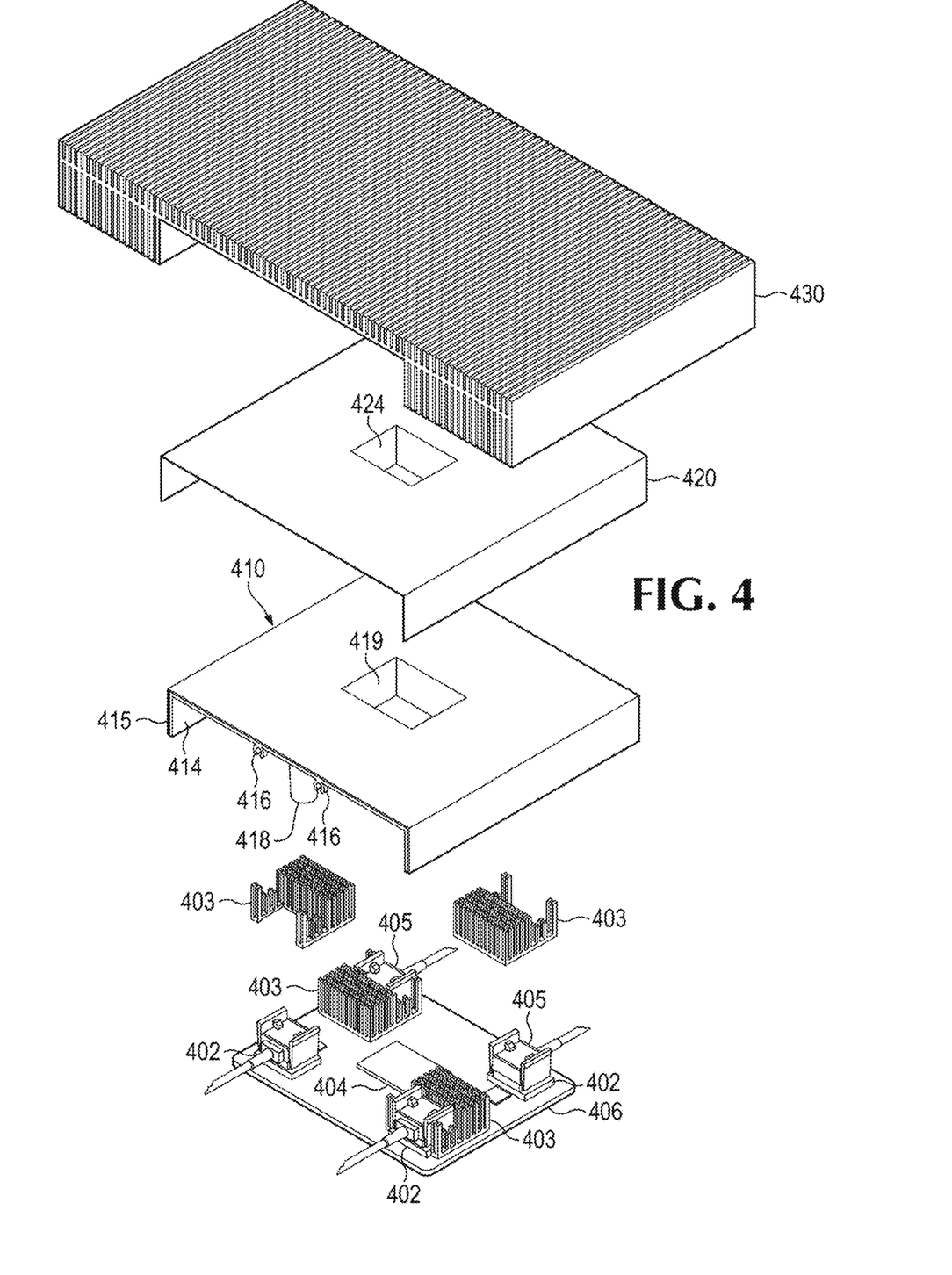
FIG. 4 is an exploded perspective view of a system including a first shield and a second shield according to an example.

FIG. 4 is an exploded perspective view of a system including a first shield 410 and a second shield 420 according to an example. The heat sink 430 is to contact the second component 404, and has a cavity to accommodate the first components 402 and their associated heatsinks 403. Optical connectors 405 are also associated with the first component 402. The first and second components 402, 404 are shown as an ASIC co-packaged with optical transceivers on a substrate 406. Optical cables terminated on optical connectors 405 are shown to be attached to the optical transceiver first components 402.

The first shield 410 can be a heat shield assembly of multiple layers. The second shield 420 is shown as a Graphene layer, to be adhered to an underside cavity of the second heat sink 430. The first and second shields 410, 420 can be provided separately, with separation between them to create an air gap. Alternatively, the shields 410, 420 can be combined to form a thermal shield assembly, e.g., the second shield 420 can be applied to the first shield 410 as an additional layer on the first shield 410. The first shield 410 is to create an airflow cooling channel for the first components 402 and their heatsinks 403. Fin patterns of the first component heatsink(s) 403 can be arranged to cause heated air flowing from one optical transceiver to be routed to minimize shadowing the downstream first component heatsink(s) 403 in the airflow cooling channel.

The first shield 410 is also shown with inner cable management features 416, as well as standoff 418 to provide appropriate spacing for the airflow cooling channel and structural support. The first shield 410 includes first pass-through 419, and the second shield 420 includes a corresponding second pass-through 424, to accommodate the attachment extension (not visible in FIG. 4, see FIG. 5) of the heatsink 430 and allow the attachment extension to make good contact with the second component 404. There may be Thermal Interface Material (TIM) between the heatsink 430 and the second component 404.

Figure 5:
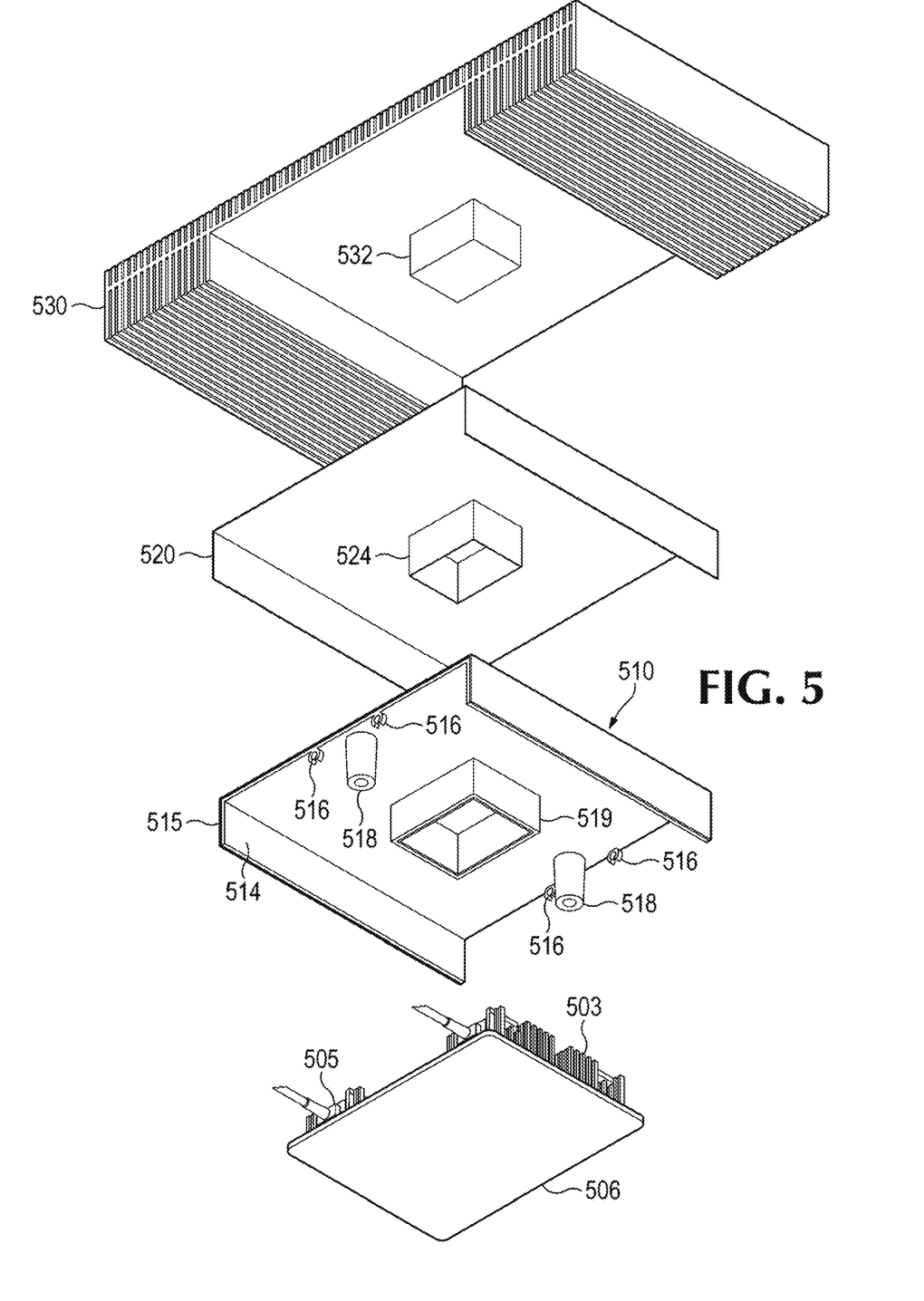
FIG. 5 is an exploded perspective view of a system including a first shield and a second shield according to an example.

FIG. 5 is an exploded perspective view of a system including a first shield 510 and a second shield 520 according to an example. The heatsink 530 is positioned to illustrate the cavity to accommodate the first components (not visible in FIG. 5, see FIG. 4) and their illustrated first component heatsink 503 and optical connector 505, as well as to illustrate the heatsink attachment extension 532 to reach the second component (also not visible in FIG. 5, see FIG. 4). The first and/or second shields 510, 520 are shown including corresponding first and second pass-throughs 519, 524.

The first shield 510 is shown having two layers, inner layer 514 and outer layer 515. The inner layer 514 may be of a first material, such as ceramic casting or injection molded plastic based on insulation requirements. The outer layer 515 may be provided as a reflective film, such as Mylar or reflective coating/paint, to reduce radiant heating. The second shield 520 may be made of Graphene or other material, including anisotropic materials.

The first shield 510 is shown including mounting standoffs 518 and inner cable management 516. The mounting standoff 518 is to ensure structural integrity of the shields and/or support the weight of the heatsink 530, and to ensure proper mounting separation from the substrate 506 to ensure good airflow in the airflow cooling channels. The cable management features also can be disposed on an outer surface of the first shield 510, in the space between the first and second shields 510, 520.

Figure 6:
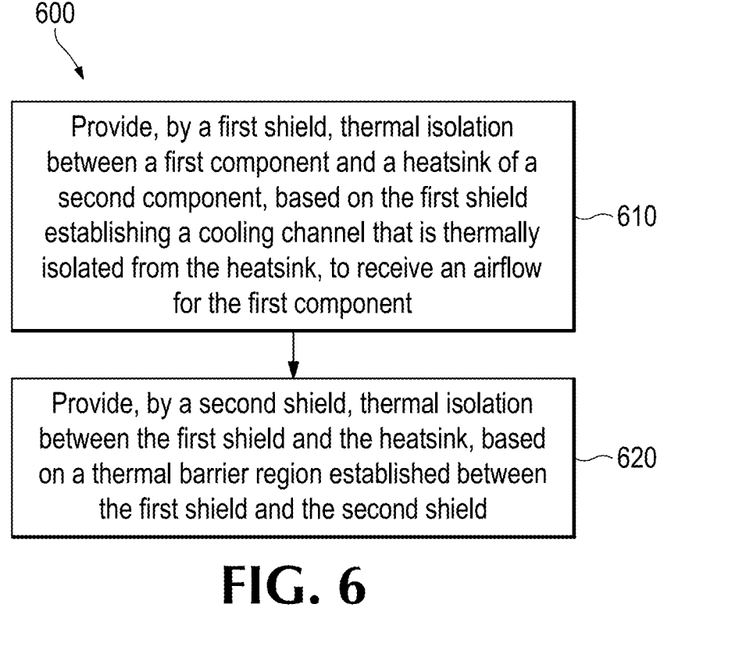
FIG. 6 is a flow chart based on providing thermal isolation according to an example.
Figure 7:
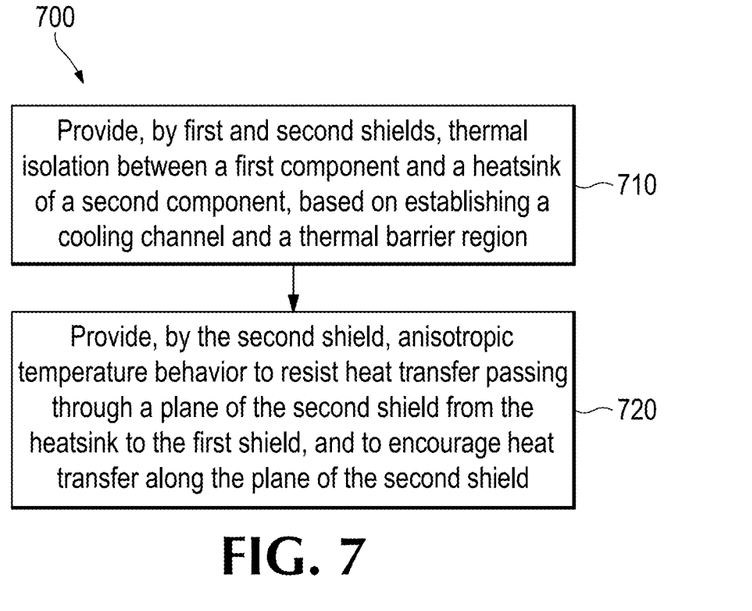
FIG. 7 is a flow chart based on providing thermal isolation according to an example.

Referring to FIGS. 6 and 7, flow diagrams are illustrated in accordance with various examples of the present disclosure. The flow diagrams represent processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 6 is a flow chart 600 based on providing thermal isolation according to an example. In block 610, a first shield is to provide thermal isolation between a first component and a heatsink of a second component, based on the first shield establishing a cooling channel that is thermally isolated from the heatsink, to receive an airflow for the first component. For example, the first shield can include two layers of different materials, to address convective and radiation heating, while establishing the cooling channel for the first component. In block 620, a second shield can provide thermal isolation between the first shield and the heatsink, based on a thermal barrier region established between the first shield and the second shield. For example, the second shield can be provided as an anisotropic material to minimize heat transfer through the second shield thickness, and encourage heat removal from the surface of the second shield into the second heatsink.

FIG. 7 is a flow chart 700 based on providing thermal isolation according to an example. In block 710, first and second shields provide thermal isolation between a first component and a heatsink of a second component, based on establishing a cooling channel and a thermal barrier region. For example, the first shield provides thermal and convective insulation, the second shield provides anisotropic thermal insulation, and the thermal barrier region between the first and second shields provides additional insulation for the cooling channel. In block 720, the second shield provides anisotropic temperature behavior to resist heat transfer passing through a plane of the second shield from the heatsink to the first shield, and to encourage heat transfer along the plane of the second shield. For example, the second shield prevents local hot spots by spreading heat along the surface of the second shield, and encourages heat removal from the second shield into the second heat sink.

What is claimed is:

1. A system comprising:
   a first shield to provide thermal isolation between a first component and a heatsink of a second component, and to provide a cooling channel that is thermally isolated from the heatsink to receive an airflow for the first component, the first shield includes an inner layer of a first material to insulate from convective heat, and an outer layer of a second material to reflect radiant heat; and a second shield to provide thermal isolation between the first shield and the heatsink, and to provide a thermal barrier region between the first shield and the second shield, the second shield includes a third material to provide anisotropic temperature behavior to resist heat transfer passing through a plane of the second shield from the heatsink toward the first shield, and to facilitate heat transfer along the plane of the second shield.

2. The system of claim 1, wherein the thermal barrier region is provided as a barrier cooling channel to receive at least a portion of the airflow.

3. The system of claim 1, wherein the thermal barrier region is filled with a fixed thermal insulator between the first shield and the second shield.

4. The system of claim 1, wherein the first shield includes an inner cable management feature disposed on an inside face of the first shield facing the first component.

5. The system of claim 1, wherein the first shield includes an outer cable management feature disposed on an outside face of the first shield facing the second shield.

6. The system of claim 1, wherein the second shield is integrated with the first shield such that a transition between the second material of the first shield, and the third material of the second shield, serves as the thermal barrier region based on differing thermal properties of the second and third materials.

7. A method, comprising:
   providing, by a first shield, thermal isolation between a first component and a heatsink of a second component, based on the first shield establishing a cooling channel that is thermally isolated from the heatsink, to receive an airflow for the first component;
   providing, by the first shield, an inner layer of a first material to insulate from convective heat, and an outer layer of a second material to reflect radiant heat;
   providing, by a second shield, thermal isolation between the first shield and the heatsink, based on a thermal barrier region established between the first shield and the second shield; and
   providing, by the second shield, anisotropic temperature behavior to resist heat transfer passing through a plane of the second shield from the heatsink to the first shield, and to facilitate heat transfer along the plane of the second shield.

8. The method of claim 7, wherein the thermal barrier region is provided as a barrier cooling channel to receive at least a portion of the airflow.

9. The method of claim 7, wherein the thermal barrier region is filled with a fixed thermal insulator between the first shield and the second shield.

10. The method of claim 7, further comprising providing an inner cable management feature disposed on an inside face of the first shield facing the first component.

11. The method of claim 7, further comprising providing an outer cable management feature disposed on an outside face of the first shield facing the second shield.

12. The method of claim 7, wherein the second shield is integrated with the first shield such that a transition between the second material of the first shield, and the third material of the second shield, serves as the thermal barrier region based on differing thermal properties of the second and third materials.

13. A system comprising:
   a heatsink including an attachment extension to contact a second component, and a cavity to accommodate a first component;
   a first shield disposed in the cavity of the heatsink to provide thermal isolation between the heatsink and a first component, and to provide a cooling channel to receive an airflow for the first component that is thermally isolated from the heatsink; and
   a second shield disposed in the cavity of the heatsink over the first shield to thermally isolate the first shield from the heatsink, and to provide a thermal barrier region between the first shield and the second shield.

14. The system of claim 13, wherein the first shield includes a first pass-through to accommodate the attachment extension of the heatsink and maintain thermal isolation of the cooling channel from the attachment extension.

15. The system of claim 13, wherein the second shield includes a second pass-through to accommodate the attachment extension of the heatsink and maintain thermal isolation of the cooling channel from the attachment extension.

16. The system of claim 13, wherein the second shield is spaced from the heatsink to provide a second thermal barrier region between the second shield and the heatsink.

17. The system of claim 13, wherein the second shield is integrated with the heatsink such that a transition between a material of the second shield, and a dissimilar material of the heatsink, serves as the thermal barrier region based on differing thermal properties of the materials of the second shield and the heat sink.

* * * * *